(12) United States Patent
Kim et al.

(10) Patent No.: US 7,661,921 B2
(45) Date of Patent: Feb. 16, 2010

(54) SEMICONDUCTOR MATERIAL HANDLING SYSTEM

(75) Inventors: Won Geyung Kim, Bucheon-si (KR); Hyun Suk Jang, Incheon (KR)

(73) Assignee: Naontech Co., Ltd., Ansan-si, Gyeonggi-do (KR)

( * ) Notice: Subject to any disclaimer, the term of this patent is extended or adjusted under 35 U.S.C. 154(b) by 267 days.

(21) Appl. No.: 11/751,792

(22) Filed: May 22, 2007

(65) Prior Publication Data
US 2007/0269302 A1    Nov. 22, 2007

(30) Foreign Application Priority Data
May 22, 2006    (KR)    ............... 10-2006-0045536

(51) Int. Cl.
*B66C 23/00*    (2006.01)
(52) U.S. Cl. ............ 414/744.5; 414/744.8; 414/941; 294/103.1; 294/119.1
(58) Field of Classification Search ............ 414/744.5, 414/744.8, 744.6, 941; 294/119.1, 103.1
See application file for complete search history.

(56) References Cited

U.S. PATENT DOCUMENTS

| | | | | |
|---|---|---|---|---|
| 5,288,199 A | * | 2/1994 | Enomoto | ............ 414/749.2 |
| 5,364,222 A | * | 11/1994 | Akimoto et al. | ........ 414/416.03 |
| 5,667,353 A | * | 9/1997 | Drake | ............ 414/744.3 |
| 6,105,454 A | * | 8/2000 | Bacchi et al. | ............ 74/490.03 |
| 6,623,235 B2 | * | 9/2003 | Yokota et al. | ............ 414/744.8 |
| 6,652,216 B1 | * | 11/2003 | Astegno et al. | ........ 414/416.03 |
| 6,769,861 B2 | * | 8/2004 | Caveney | .............. 414/783 |
| 2003/0219914 A1 | * | 11/2003 | Gaudon et al. | .............. 438/14 |
| 2005/0109088 A1 | * | 5/2005 | Woodruff et al. | .............. 73/112 |

* cited by examiner

*Primary Examiner*—Saúl J Rodríguez
*Assistant Examiner*—Jonathan D Snelting
(74) *Attorney, Agent, or Firm*—Jae Y. Park; Kile Goekjian Reed & McManus PLLC

(57) ABSTRACT

A semiconductor material handling system including a frame mounting a wafer cassette and a plurality of load ports thereon, and a wafer moving robot including a robot body which has a lifting member mounted in the frame and vertically moving along a predetermined lifting shaft, an articulated arm which has a driving link mounted in the lifting member and a plurality of driven links whose end part transversely moving along the frame having the load ports, a swing unit which is mounted in the end part of the driven links and rotates along a vertical rotation shaft, and a crossing arm which comprises a base mounted in the swing unit, a plurality of sliding units mounted in the base and reciprocating transversely, and a wafer hand mounted in the sliding units and picking up a wafer from the wafer cassette and storing the wafer back in the wafer cassette.

6 Claims, 10 Drawing Sheets

SEMICONDUCTOR MATERIAL HANDLING SYSTEM

CROSS-REFERENCE TO RELATED APPLICATIONS

This application claims priority from Korean Patent Application No. 2006-0045536, filed on May 22, 2006, in the Korean Intellectual Property Office, the disclosure of which is incorporated herein by reference.

BACKGROUND OF THE INVENTION

1. Field of the Invention

Apparatuses consistent with the present invention relate to a semiconductor material handling system (equipment front end module, EFEM), and more particularly, to a semiconductor material handling system (equipment front end module, EFEM) which picks up a wafer from a wafer cassette, moves and stores the wafer in a processing equipment of a semiconductor production line.

2. Description of the Related Art

Recently, semiconductor manufacturers are focusing on manufacturing chips that are small, cheap and provide high performance. Thus, there is a growing demand for developing a micro line technology and a semiconductor manufacturing equipment which has excellent throughput and reduces footprint.

Meanwhile, high cleanness is required in the semiconductor manufacturing equipment and manufacturing plant to apply the micro line technology to manufacturing the chips. Generally, a front open unified pod (FOUP), a kind of a wafer cassette, is used as a standard transfer unit to protect a wafer from particles.

A semiconductor material handling system (equipment front end module, EFEM) includes an interface module which connects a wafer cassette and a processing equipment in a semiconductor wafer manufacturing process. FIG. 1 illustrates a conventional semiconductor material handling system (EFEM) which is provided in a semiconductor manufacturing line. FIG. 2 illustrates an internal part of the conventional semiconductor material handling system (EFEM).

As shown in FIG. 1, the semiconductor manufacturing line includes a wafer cassette storage 10, a mono rail 20, a semiconductor material handling system (EFEM) 30, and a processing equipment 40. A wafer is supplied to the processing equipment 40 through a wafer cassette 50.

More specifically, the wafer cassette 50 is supplied from the wafer cassette storage 10 to the semiconductor material handling system (EFEM) 30 through the mono rail 20. A wafer moving robot which is mounted in the semiconductor material handling system (EFEM) 30 picks up a sheet of wafer from the wafer cassette 50 and supplies it to the processing equipment 40, and stores the processed wafer back to the wafer cassette 50.

As shown in FIG. 2, the conventional semiconductor material handling system (EFEM) 30 includes a frame 33 which forms an external appearance of the semiconductor material handling system (EFEM) 30, a load port 32 which receives the wafer cassette 50, a wafer moving robot 31 which moves a wafer 60 within the semiconductor material handling system (EFEM) 30 and a pre-aligner 34 which aligns the wafer 60.

The wafer moving robot 31 is mounted in a moving unit 36 which reciprocates a rail shaft 35. The wafer moving robot 31 moves to a desired load port 32 along the rail shaft 35 and picks up the wafer 60 from the wafer cassette 50 stably seated in the load port 32, and stores the wafer 60 back to the wafer cassette 50 after the processing operation is completed.

In the semiconductor material handling system (EFEM) 30, the wafer moving robot 31 moves along the rail shaft 35. Thus, there is a high possibility of disturbing laminar flow of a fan filter unit (FFU) which removes particles from the EFEM 30. As the movement of the moving unit 36 may generate particles, the moving unit 36 may not be appropriate for the semiconductor material handling system (EFEM) 30 which requires high cleanness. Furthermore, the rail shaft 35 requires an additional space other than an actual moving distance, thereby occupying a relatively large footprint.

The conventional semiconductor material handling system (EFEM) 30 includes the pre-aligner 34 to adjust a direction of the wafer 60 before supplying the wafer 60 to the processing equipment 40 or before storing the wafer 60 back to the wafer cassette 50.

The wafer processing speed is an essential factor in determining performance of the semiconductor manufacturing equipment. The performance of the semiconductor manufacturing equipment is much influenced by every 0.1 second. However, if the pre-aligner 34 aligns the wafer 60 while the wafer 60 is moved, the throughput of the semiconductor material handling system (EFEM) 30 is lowered.

Also, the pre-aligner 34 requires an additional space to be installed, thereby further increasing the footprint.

SUMMARY OF THE INVENTION

Accordingly, it is an aspect of the present invention to provide a semiconductor material handling system (equipment front end module, EFEM) which improves cleanness and throughput, and reduces a footprint.

Additional aspects and/or advantages of the present invention will be set forth in part in the description which follows and, in part, will be obvious from the description, or may be learned by practice of the present invention.

The foregoing and/or other aspects of the present invention can be achieved by providing a semiconductor material handling system which has a frame mounting a wafer cassette and a plurality of load ports thereon, and a wafer moving robot, the semiconductor material handling system comprising the wafer moving robot comprising a robot body which has a lifting member mounted in the frame and vertically moving along a predetermined lifting shaft; an articulated arm which has a driving link mounted in the lifting member and a plurality of driven links whose end part transversely moving along the frame having the load ports; a swing unit which is mounted in the end part of the driven links and rotates along a vertical rotation shaft; and a crossing arm which comprises a base mounted in the swing unit, a plurality of sliding units mounted in the base and reciprocating transversely, and a wafer hand mounted in the sliding units and picking up a wafer from the wafer cassette and storing the wafer back in the wafer cassette.

According to an aspect of the invention, the crossing arm further comprises a plurality of driven rollers which has a wafer grip groove to insert the wafer stably seated on the wafer hand into a circumference thereof, and mounted in an end of the wafer hand along the circumference of the wafer; a driving roller which is mounted in the base to be engaged with the circumference of the wafer and rotate wafer if the wafer hand picking up the wafer returns to the base; and a wafer aligner which has a sensor to sense a rotation position of the wafer.

According to an aspect of the invention, the wafer hand further comprises a moving roller which reciprocates to grip the wafer together with the driven rollers, and a wafer grip unit which has a linear motion unit to move the moving roller.

According to an aspect of the invention, the driven rollers comprise a circumference which is inclinedly formed on an upper part of the wafer grip groove, and the wafer hand further comprises an anti-separation projection which has an internally inclined surface and corresponds to the driven roller.

According to an aspect of the invention, the wafer grip groove of the driven roller has a V-shaped groove, and the wafer hand further comprises a wafer supporting pad which supports the wafer to be stably seated on a position as high as an internal lower surface of the wafer grip groove.

According to an aspect of the invention, the base comprises a roller which has a round surface corresponding to a center of the wafer grip groove.

BRIEF DESCRIPTION OF THE DRAWINGS

The above and/or other aspects of the present invention will become apparent and more readily appreciated from the following description of the exemplary embodiments, taken in conjunction with the accompany drawings of which.

DETAILED DESCRIPTION OF EXEMPLARY EMBODIMENTS

Hereinafter, exemplary embodiments of the present invention will be described with reference to accompanying drawings, wherein like numerals refer to like elements and repetitive descriptions will be avoided as necessary.

Figure 1:
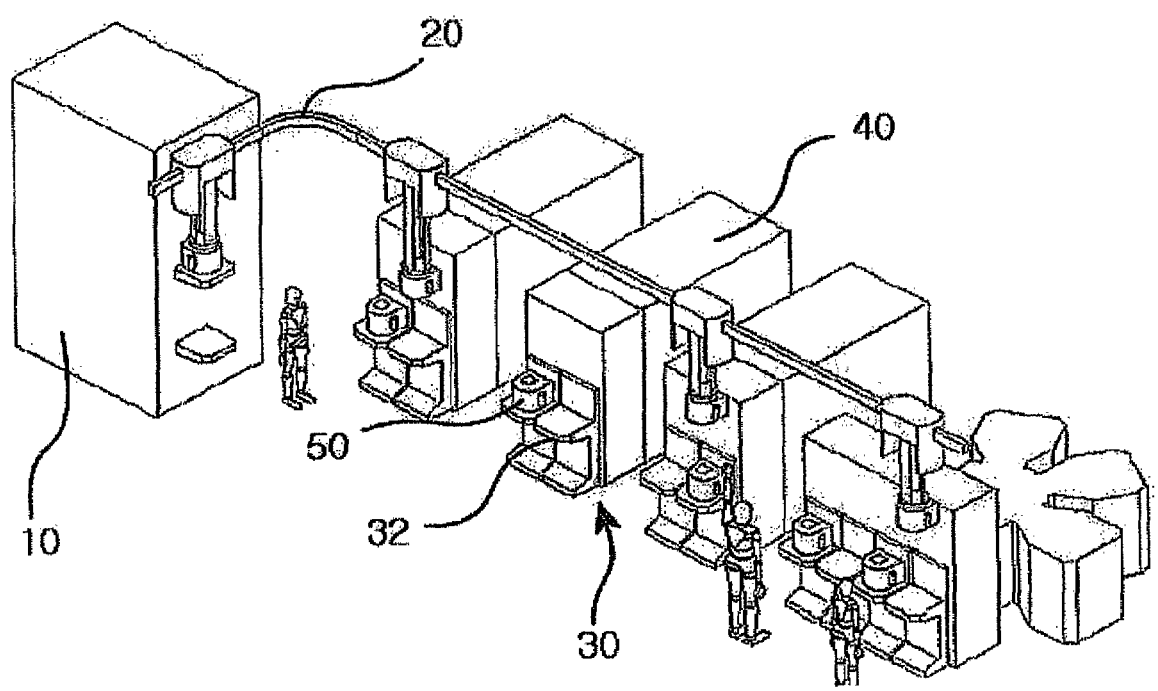
FIG. 1 illustrates a configuration of a conventional semiconductor manufacturing line.
Figure 2:
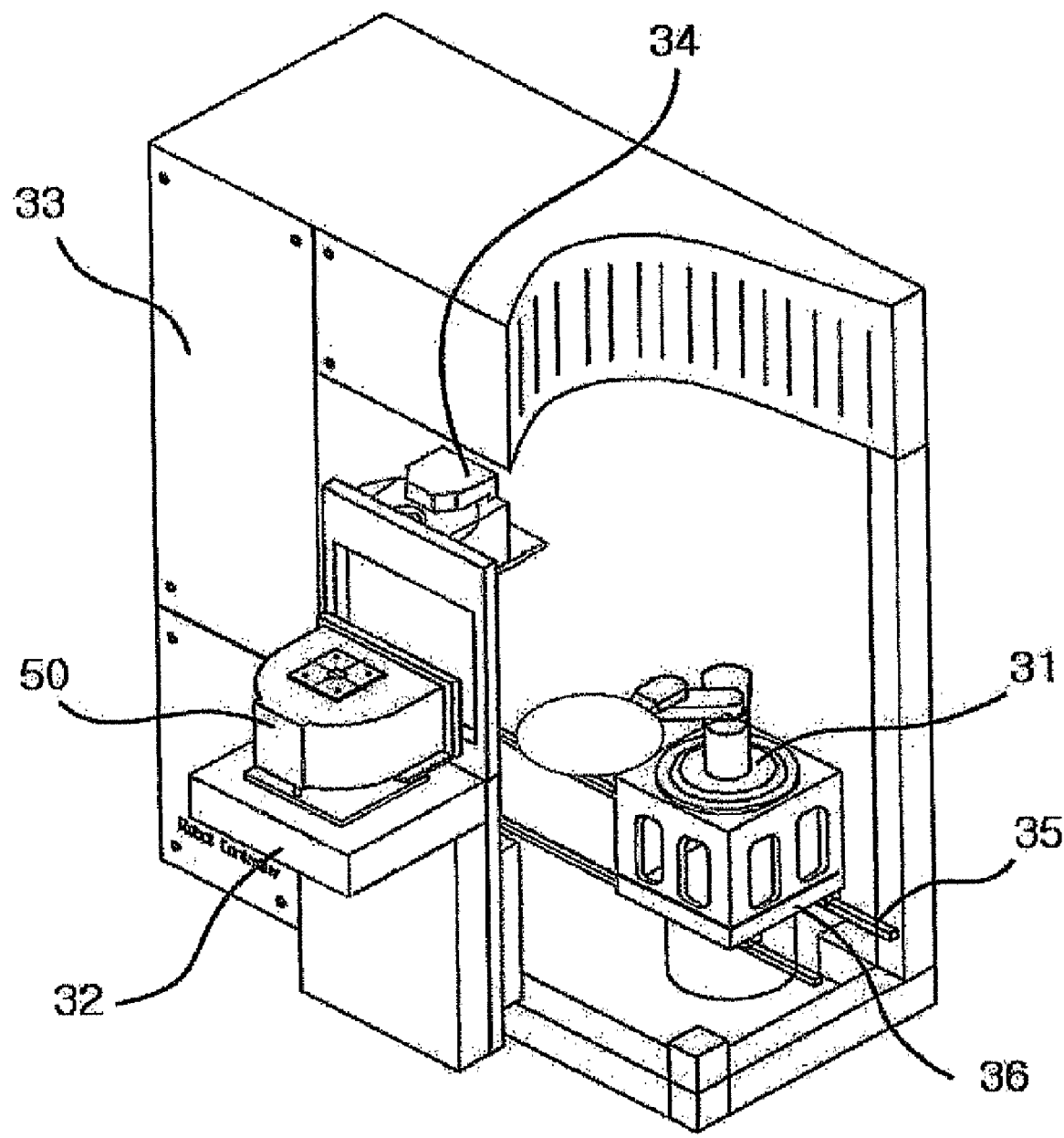
FIG. 2 is a sectional view of a conventional semiconductor material handling system (equipment front end module, EFEM)
Figure 3:
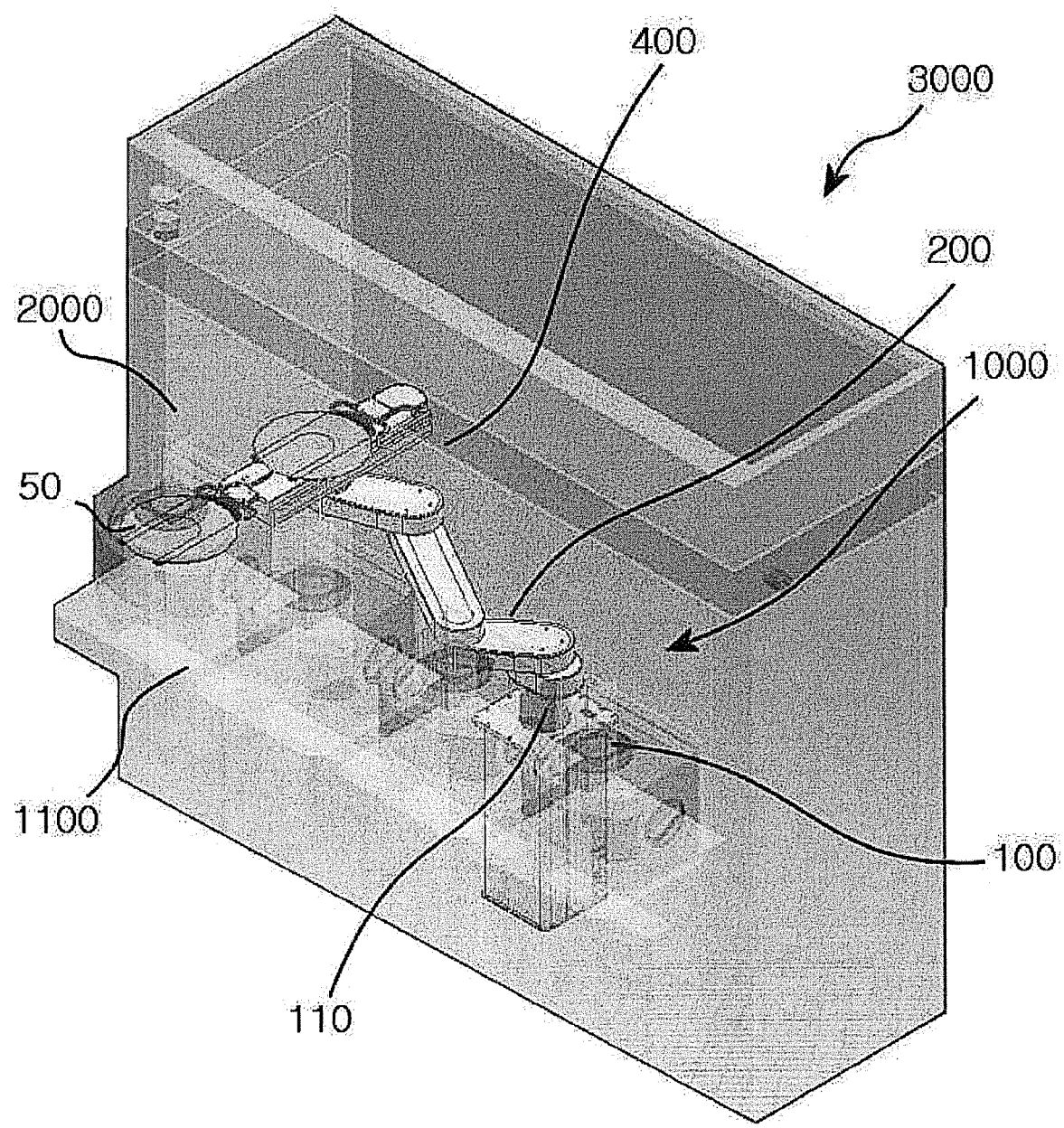
FIG. 3 is a perspective view of an internal part of a semiconductor material handling system (equipment front end module, EFEM) according to an exemplary embodiment of the present invention.
Figure 4:
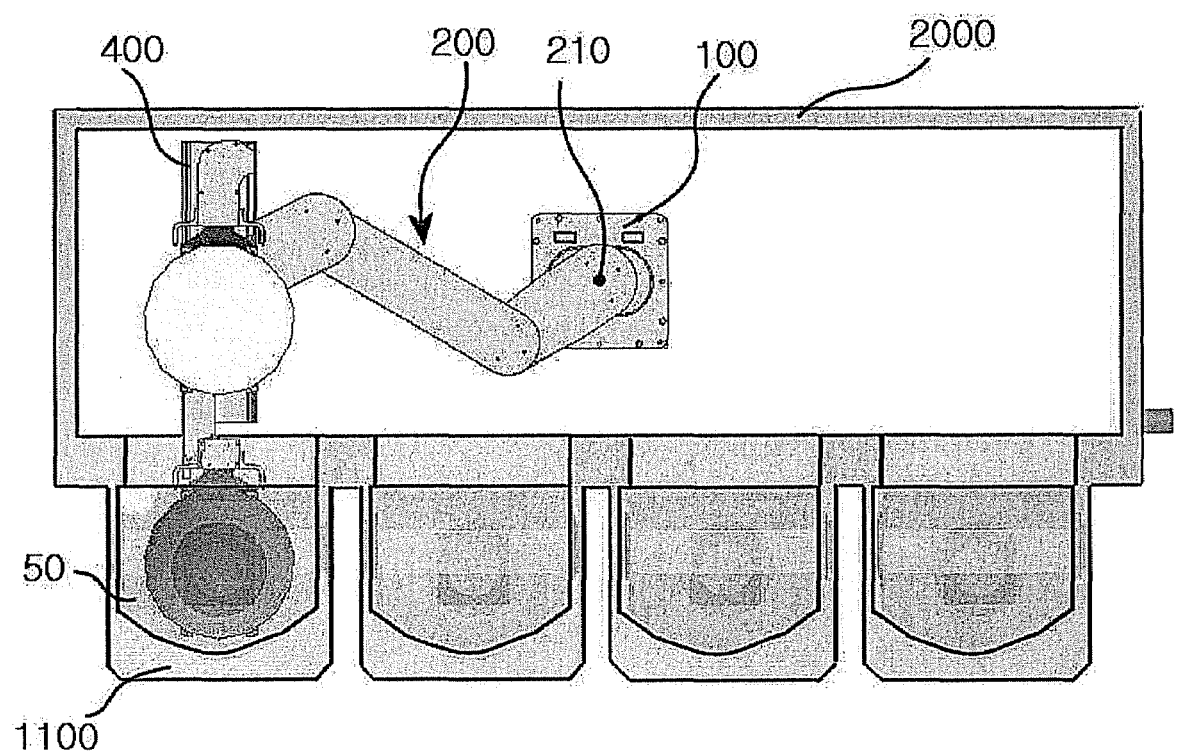
FIG. 4 is a plan view of the semiconductor material handling system (EFEM) according to the exemplary embodiment of the present invention.

FIG. 3 is a perspective view of a semiconductor material handling system (equipment front end module, EFEM) according to an exemplary embodiment of the present invention. FIG. 4 is a schematic plan view of the semiconductor material handling system (EFEM) according to the exemplary embodiment of the present invention.

As shown in FIG. 3, a semiconductor material handling system (equipment front end module, EFEM) 3000 according to an exemplary embodiment of the present invention includes a frame 2000 which forms an external appearance of the semiconductor material handling system (EFEM) 3000, a load port 1100 which receives a wafer cassette 50, and a wafer moving robot 1000 which moves a wafer within the semiconductor material handling system (EFEM) 3000.

A wafer moving robot of a conventional semiconductor material handling system (EFEM) is mounted on a moving unit which reciprocates a rail shaft. Meanwhile, the wafer moving robot 1000 according to the exemplary embodiment of the present invention does not need an additional moving unit.

As shown therein, a height of the wafer moving robot 1000 is adjusted as a lifting member 110 of a robot body 100 provided in the frame 2000 moves vertically. The wafer moving robot 1000 transversely moves to the desired load port 1100 by an operation of an articulated arm 200 provided in the lifting member 110. Thus, the wafer moving robot 1000 picks up the wafer from the wafer cassette 50 and stores the processed wafer back in the wafer cassette 50.

The articulated arm 200 may include two or three links depending on various moving distances due to the increased number of the load ports 1100.

As shown in FIG. 4, a driving link base end 210 of the articulated arm 200 is mounted in the lifting member 110 and vertically moves by the movement of the lifting member 110. A swing unit 300 (refer to FIG. 5) and a crossing arm 400 are formed on a driven link end part 220 of the articulated arm 200 to move rotatably and linearly.

In the conventional semiconductor material handling system (EFEM), the moving unit moves along the rail shaft, thereby creating particles by friction with the rail shaft. Also, it has a limitation in covering particles since the moving unit moves continuously.

However, the wafer moving robot 1000 employed in the semiconductor material handling system (EFEM) 3000 according to the present invention moves transversely with the articulated arm 200 and does not employ the moving unit, thereby fundamentally reducing particles.

Also, the conventional semiconductor material handling system (EFEM) includes a fan filter unit (FFU) so that air flows downwards. The movement of the moving unit and the robot body may disturb laminar flow.

However, the semiconductor material handling system (EFEM) 3000 according to the present invention does not include the moving unit, and the robot body 100 which takes most of space in the wafer moving robot 1000 is fixed. Thus, the foregoing problems are prevented.

Moreover, the additional space for mounting the rail shaft is reduced, thereby decreasing overall footprint of the semiconductor material handling system (EFEM) 3000.

The robot body 100 of the wafer moving robot 1000 is fixed, and thus the weight of a moving part of the wafer moving robot 1000 is decreased to move faster and improve operation speed.

The semiconductor material handling system (EFEM) 3000 supplies the wafer from the wafer cassette 50 to a processing equipment, and stores the processed wafer back to the wafer cassette 50. To support such a function, the semiconductor material handling system (EFEM) 3000 requires a rotation unit to contact both the wafer cassette 50 and the processing equipment.

The crossing arm 400 which is mounted in the swing unit 300 picks up the wafer from the wafer cassette 50, and stores the processed wafer back to the wafer cassette 50.

Figure 5:
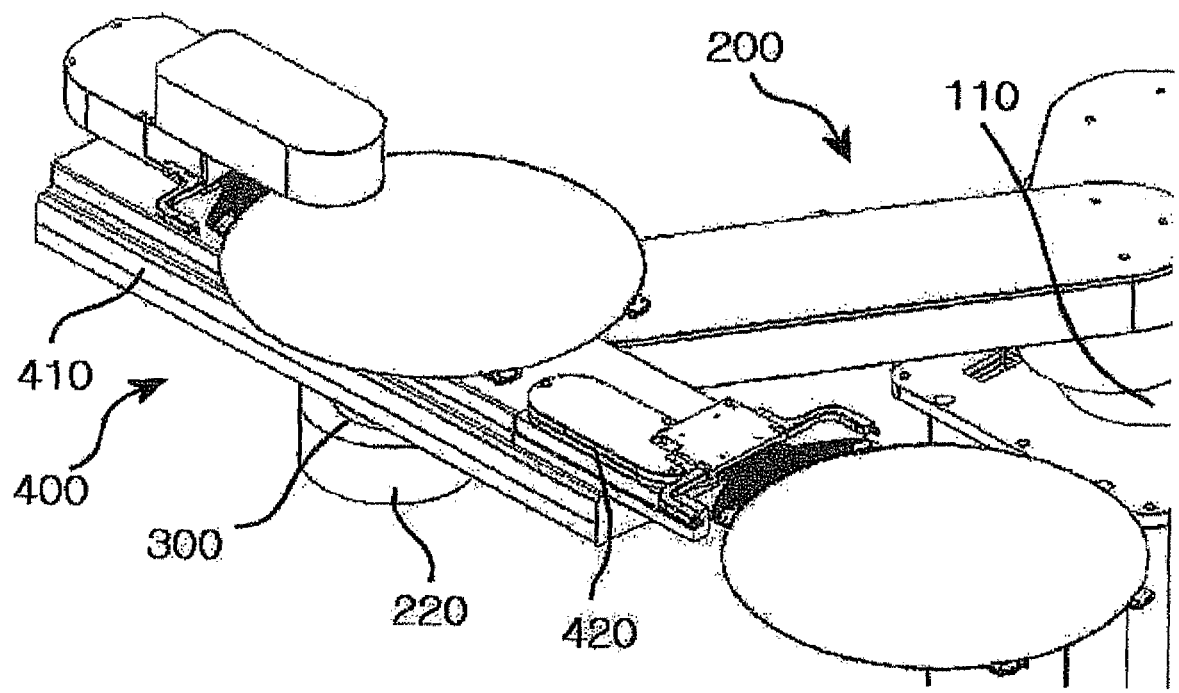
FIG. 5 is a perspective view of a crossing arm of the semiconductor material handling system (EFEM) according to the exemplary embodiment of the present invention.

FIG. 5 is a perspective view of the crossing arm 400 of the wafer moving robot 1000 in the semiconductor material handling system (EFEM) 3000 according to the exemplary embodiment of the present invention.

As shown therein, the crossing arm 400 of the semiconductor material handling system (EFEM) 3000 according to the exemplary embodiment of the present invention includes a base 410 which is provided in the swing unit 300 of the driven link end part 220, a sliding unit 420 which is mounted in the base 410 and reciprocates in a transverse direction, and a wafer hand 430 which is disposed in the sliding unit 420 to pick up the wafer 60 from the wafer cassette 50 and store it back thereto.

The sliding unit 420 may be solely provided in the base 410. Alternatively, at least two sliding units 420 may be mounted in the base 410 to swap the wafer quickly as shown in FIG. 5. Up to four sliding units 420 may be mounted in the base 410 to improve the operation speed as necessary.

The sliding unit 420 may include a belt or a rack and pinion, and preferably a linear motor to move more precisely and secure highly clean environment.

Figure 6:
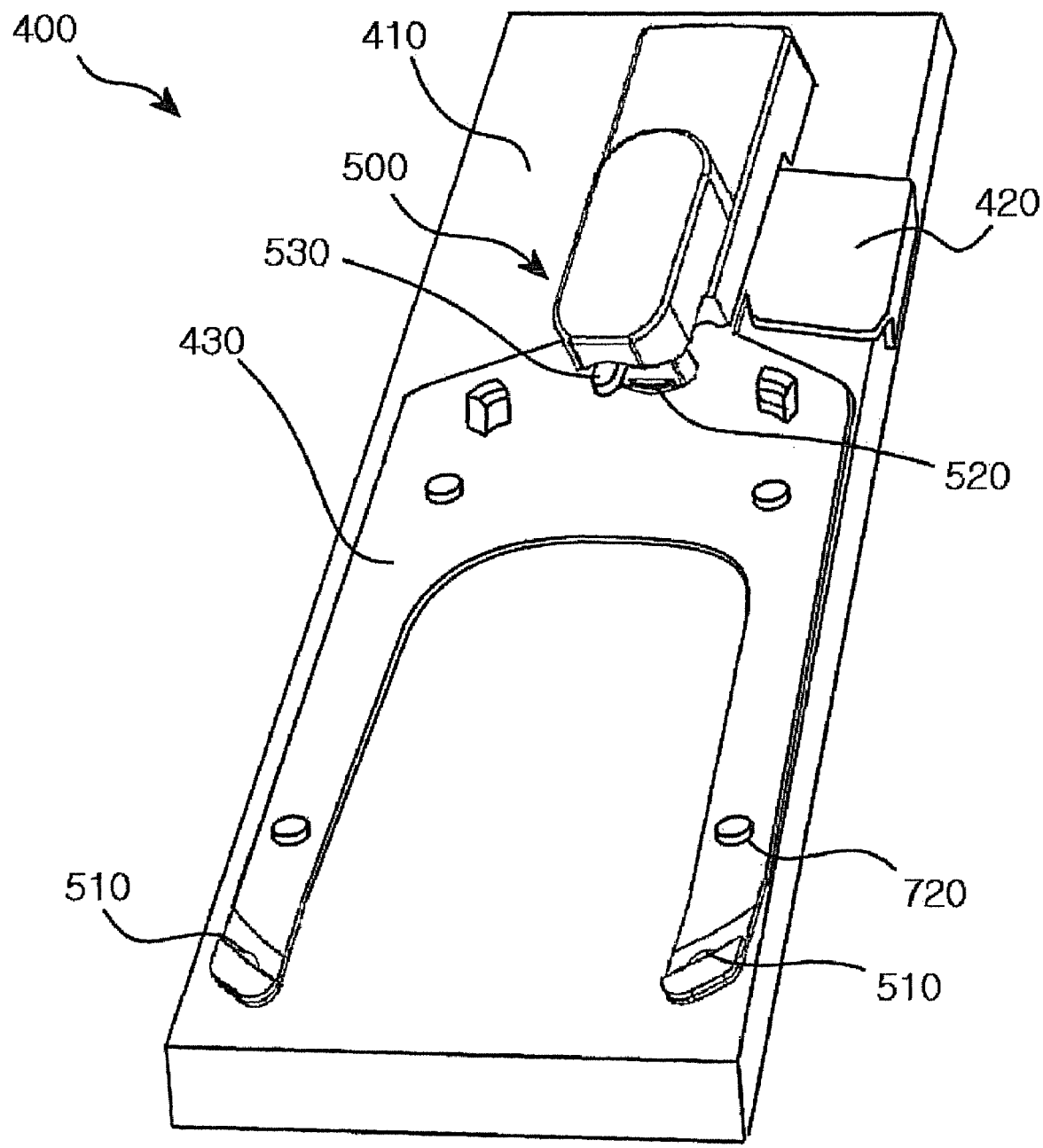
FIG. 6 is an enlarged view of the crossing arm having a wafer aligner according to the exemplary embodiment of the present invention.
Figure 7:
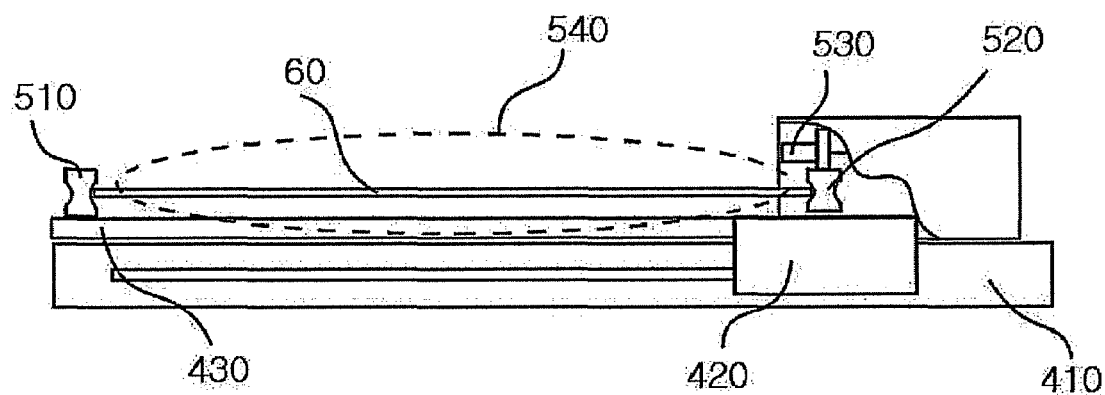
FIG. 7 a lateral view of a wafer position adjusting space.

FIG. 6 is a perspective view of a wafer aligner 500 which adjusts a direction of the picked wafer 60. FIG. 7 illustrates a wafer position adjusting space 540 which is formed by the wafer hand 430 that picks up the wafer 60 and returns to the base 410 to align the wafer 60.

As shown therein, the wafer aligner 500 includes a driven roller 510 which prevents the wafer 60 from being separated and rotates the wafer 60, a driving roller 520 which rotates the wafer 60 to be directed to a predetermined position, and a sensor 530 which senses the direction and position of the wafer 60.

As shown in FIG. 6, the wafer 60 is picked up by the wafer hand 430, and a part of a circumference thereof is engaged with the driven roller 510 and an opposite part thereof is engaged with the driving roller 520 mounted in the base 410 as the wafer hand 430 returns to the base 410.

The wafer 60 includes a notch on a predetermined part of the circumference to determine a position thereof. Thus, the direction of the wafer 60 is sensed by the sensor 530, and the wafer 60 is rotated by the driving roller 520 to be aligned in a predetermined direction.

As shown in FIG. 7, the driven roller 510 includes a wafer grip groove 511 on a circumference thereof to insert the wafer 60 thereinto. Thus, the wafer 60 is prevented from being separated from the wafer hand 430. Preferably, the driving roller 520 includes a wafer grip groove to prevent the wafer 60 from being separated from the wafer hand 430 and keep a balance like the driven roller 510 does.

As the driving roller 520 and the sensor 530 which are large are mounted in the base 410 of the crossing arm 400 instead of in the wafer hand 430, the wafer hand 430 moves backward and forward to pick up and store the wafer 60 without difficulty even within a small space such as a slot of the wafer cassette 50.

Also, the wafer 60 is aligned in the wafer moving robot 1000 instead of by an additional pre-aligner, thereby occupying a smaller space compared to the conventional semiconductor material handling system (EFEM).

Also, the wafer 60 is aligned while being moved from the wafer cassette 50 to the processing equipment or from the processing equipment to the wafer cassette 50, thereby improving the operation speed and throughput.

The wafer hand 430 further includes a wafer grip unit 600 to prevent the wafer 60 from being separated from the wafer hand 430 and moved faster while the wafer 60 is picked up.

Figure 8:
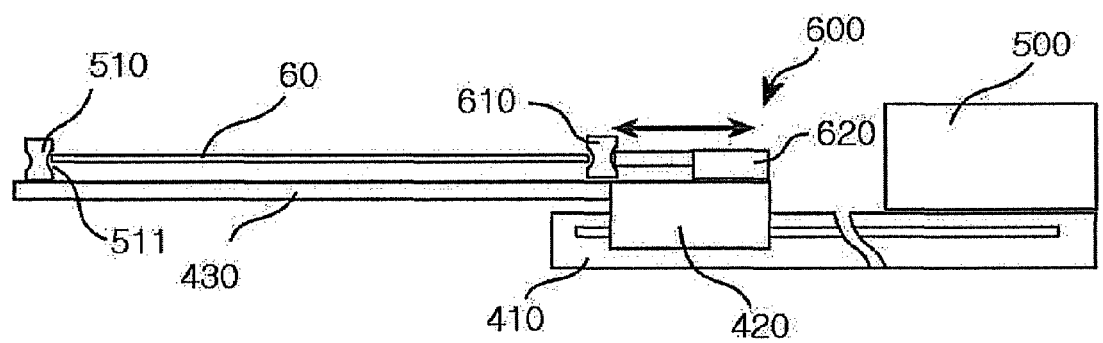
FIG. 8 is a lateral view of a wafer grip unit.

FIG. 8 is a lateral view of the wafer grip unit 600.

As shown therein, the wafer grip unit 600 includes a moving roller 610 which is mounted in the wafer hand 430 corresponding to the driven roller 510 and reciprocates toward the wafer 60 to grip the wafer 60 together with the driven roller 510, and a linear motion unit 620 which moves the moving roller 610.

More specifically, the moving roller 610 moves forward by the linear motion unit 620 driven by a pneumatic motor or an electric motor, and the wafer 60 is gripped by both the driven roller 510 and the moving roller 610 mounted in the opposite ends of the wafer hand 430 and prevented from being separated.

A position of the wafer 60 is fixed by force supplied through the moving roller 610. The wafer 60 is moved by the moving roller 610 and inserted into the wafer grip groove 511 of the driven roller 510, thereby fixing the position of the wafer 60.

To grip the wafer 60 more stably, the moving roller 610 preferably includes the wafer grip groove corresponding to that of the driven roller 510 as shown in FIG. 8.

The moving roller 610 moves forward by the linear motion unit 620 and grips the wafer 60, and also rotates the wafer 60 together with the driven roller 510 while the wafer 60 is aligned.

That is, the wafer 60 maintains its position and rotates by the driven roller 510 and the moving roller 610 even while being rotated by the wafer aligner 500. Here, the wafer hand 430 returns to the base 410.

As described above, the wafer 60 is gripped by using the linear motion unit 620. Alternatively, a wafer seating part may be formed on the wafer hand 430 to stably seat the wafer 60 thereon. Then, the wafer 60 may not be separated from the wafer hand 430 even while being moved fast.

Figure 9:
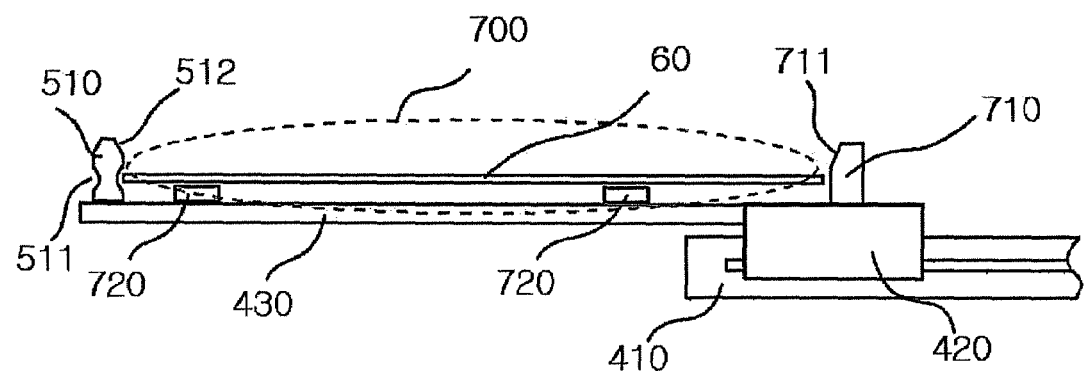
FIG. 9 is a lateral view of a wafer hand which includes a wafer mounting part.

FIG. 9 is a lateral view of a wafer hand 430 of a semiconductor material handling system (equipment front end module, EFEM) according to another exemplary embodiment of the present invention.

As shown therein, a driven roller 510 is mounted in a wafer hand 430, and includes an upwardly tapering upper end portion with an inclined circumferential surface 512 above a wafer grip groove 511. An anti-separation projection 710 which includes an inclined surface 711 internally is mounted in the wafer hand 430 opposite and corresponding to the driven roller 510, thereby forming a wafer seating part 700.

With the foregoing configuration, the wafer hand 430 which is positioned below a slot of the wafer cassette 50 moves upward and picks up the wafer 60. The inclined circumferential surface 512 and the inclined surface 711 guide the wafer 60 to be stably seated on a predetermined position of the wafer hand 430.

Even if the wafer 60 is not correctly disposed in the slot of the wafer cassette 50 or in the processing equipment, the wafer slides along the inclined circumferential surface 512 and the inclined surface 711 while being picked up, and stably seated on the predetermined position.

As shown in FIG. 9, a wafer supporting pad 720 may be provided in the wafer hand 430 to stably support the wafer 60 which is stably seated on the wafer seating part 700.

Figure 10:
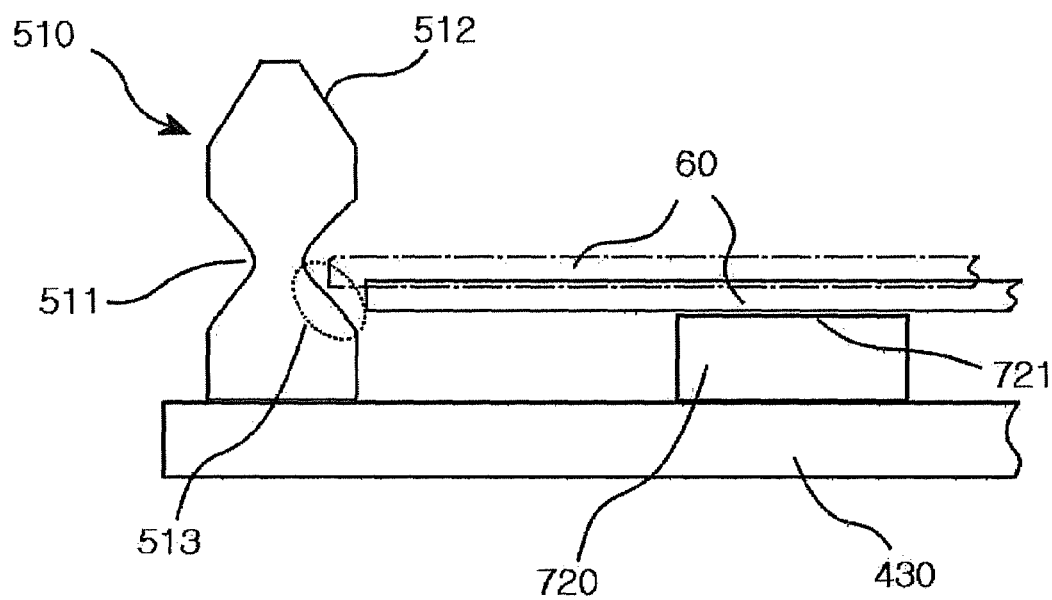
FIG. 10 illustrates a position relation between a driven roller and a wafer supporting pad.

FIG. 10 illustrates a position relation between a driven roller 510 and a wafer supporting pad 720 of a wafer hand 430 in a semiconductor material handling system (equipment front end module, EFEM) according to another exemplary embodiment of the present invention.

As shown therein, a wafer grip groove 511 of the driven roller 510 has a V-shape so that a wafer 60 is easily inserted into a center of the wafer grip groove 511.

As shown therein, the wafer supporting pad 720 is provided in a wafer seating part 700 so that an upper surface 721 of the wafer supporting pad 720 is as high as an internal lower surface 513 of the wafer grip groove 511.

Thus, the wafer 60 is easily inserted into the wafer grip groove 511 when the wafer hand 430 moves toward the wafer aligner 500 (to be described later).

As illustrated as a solid line in FIG. 10, the wafer 60 which is supplied from the wafer cassette 50 to the wafer hand 430 is disposed out of the circumference of the driven roller 510. The wafer 60 is then inserted into the wafer grip groove 511 to rotate without difficulty.

The wafer 60 which is picked up by the wafer hand 430 moves to a wafer position adjusting space 540 and contacts a driving roller 520 mounted in a base 410 of a crossing arm 400. Then, a slippage occurs between the wafer 60 and the wafer supporting pad 720, and the wafer 60 presented as a dotted line in FIG. 10 moves upward along an inclined surface 513 of the wafer grip groove 511 and is inserted into the wafer grip groove 511.

If the wafer 60 is fully inserted into the wafer grip groove 511, a predetermined space is formed between the wafer 60 and the wafer supporting pad 720. Thus, even if the wafer 60 rotates, the wafer 60 is not damaged by friction with the wafer supporting pad 720 and rotates without difficulty.

Figure 11:
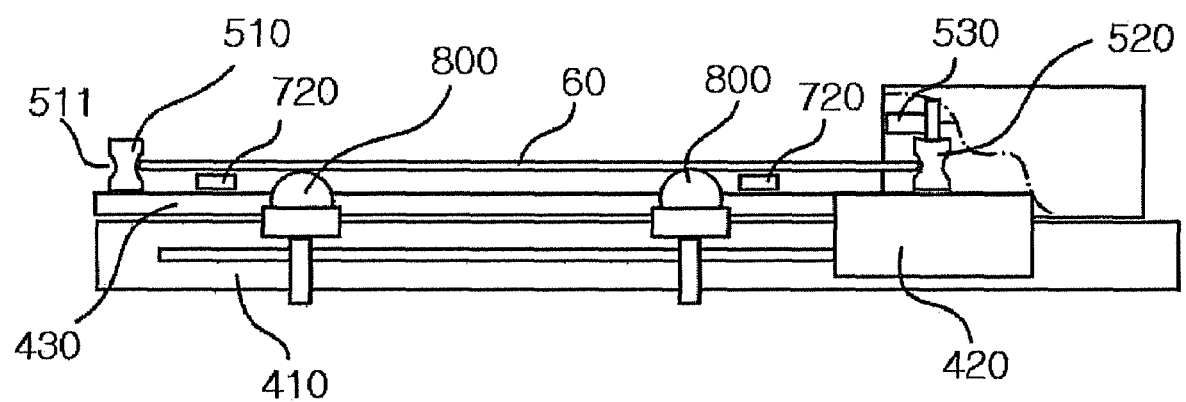
FIG. 11 is a lateral view of a crossing arm whose base is mounted with a roller.
Figure 12:
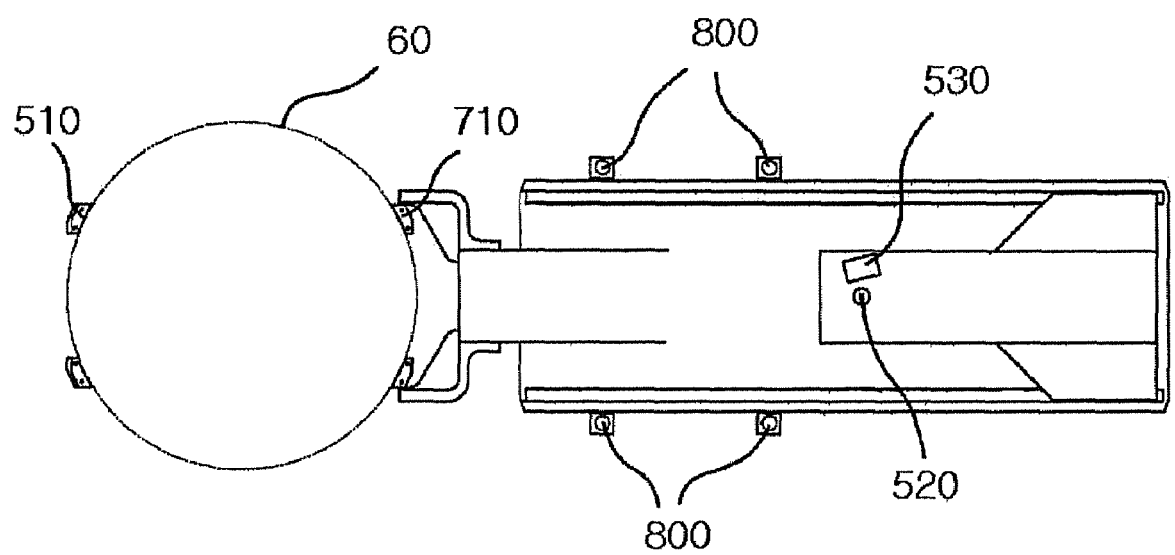
FIG. 12 illustrates an operation of the crossing arm having the roller.

FIG. 11 is a lateral view of a crossing arm 400 which includes a roller 800 in a semiconductor material handling system (equipment front end module, EFEM) 3000 according to another exemplary embodiment of the present invention. FIG. 12 illustrates an operation of the crossing arm 400 having the roller.

As shown in FIG. 11, a base 410 of the semiconductor material handling system (EFEM) 3000 according to another exemplary embodiment of the present invention may include a roller 800 to grip and rotate a wafer 60 more efficiently.

As shown in FIG. 11, the base 410 includes the roller 800 having a round surface corresponding to a center of a wafer grip groove 511 of a driven roller 510.

As shown in FIGS. 11 and 12, if a wafer hand 430 which picks up the wafer 60 returns to a wafer position adjusting space 540, the wafer 60 picked up by the wafer hand 430 contacts the roller 800 and moves upward along the roller 800 and is positioned on a position as high as the center of the wafer grip groove 511.

Then, the wafer 60 is precisely inserted into the wafer grip groove 511 of the driven roller 510, and rotates without being shaken. As the wafer 60 rotates on the roller 800, a bottom of the wafer 60 is not damaged.

The roller 800 preferably includes a roller having a ball shape corresponding to rotation along the circumference, as well as the transverse movement of the wafer 60.

As described above, a semiconductor material handling system (equipment front end module, EFEM) according to an exemplary embodiment of the present invention moves transversely with an articulated arm, uses a space efficiently by reducing a footprint, and removes factors which cause particles and disturb air flow within the equipment to promote high clean environment for a processing operation.

Also, the semiconductor material handling system (EFEM) according to the present invention aligns a position of a wafer while moving a wafer, saves space and reduces processing time to improve productivity.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A semiconductor material handling system which has a frame mounting a wafer cassette and a plurality of load ports thereon, and a wafer moving robot, the wafer moving robot comprising:

a robot body which has a lifting member mounted in the frame and vertically moving along a predetermined lifting shaft;

an articulated arm which has a driving link mounted in the lifting member and a plurality of driven links whose end part transversely moves along the frame having the load ports;

a swing unit which is mounted in the end part of the driven links and rotates along a vertical rotation shaft; and a crossing arm which comprises a base mounted in the swing unit, a plurality of sliding units mounted in the base and reciprocating transversely, and a wafer hand mounted in the sliding units and picking up a wafer from the wafer cassette and storing the wafer back in the wafer cassette;

wherein the crossing arm includes a plurality of driven rollers each of which has a wafer grip groove to insert the wafer stably seated on the wafer hand into a circumference thereof, and mounted in an end of the wafer hand along the circumference of the wafer; a driving roller which is mounted in the base to be engaged with the circumference of the wafer and rotate the wafer when the wafer hand picking up the wafer returns back to the base; and a wafer aligner which has a sensor to sense a rotation position of the wafer; wherein each of the driven rollers comprises an upwardly tapering upper end portion with an inclined circumferential surface above the wafer grip groove to guide the wafer onto the wafer hand.

2. The semiconductor material handling system according to claim 1, wherein the wafer hand further comprises a moving roller which reciprocates to grip the wafer together with the driven rollers, and a wafer grip unit which has a linear motion unit to move the moving roller.

3. The semiconductor material handling system according to claim 1, wherein the wafer hand further comprises an anti-separation projection which has an internally inclined surface and is opposite and corresponds to the driven roller.

4. The semiconductor material handling system according to claim 3, wherein the wafer grip groove of the driven roller has a V-shaped groove, and the wafer hand further comprises a wafer supporting pad which supports the wafer to be stably seated on a position as high as an internal lower surface of the wafer grip groove.

5. The semiconductor material handling system according to claim 3, wherein the base comprises a roller which has a round surface corresponding to a center of the wafer grip groove.

6. The semiconductor material handling system according to claim 4, wherein the base comprises a roller which has a round surface corresponding to a center of the wafer grip groove.

* * * * *